United States Patent
Yamazawa et al.

(10) Patent No.: US 10,941,280 B2
(45) Date of Patent: Mar. 9, 2021

(54) LIQUID SEALING MATERIAL FOR COPPER BUMP, AND RESIN COMPOSITION FOR USE AS SAME

(71) Applicant: NAMICS Corporation, Niigata (JP)

(72) Inventors: Tomoya Yamazawa, Niigata (JP); Haruyuki Yoshii, Niigata (JP)

(73) Assignee: NAMICS CORPORATION, Niigata (JP)

( * ) Notice: Subject to any disclaimer, the term of this patent is extended or adjusted under 35 U.S.C. 154(b) by 0 days.

(21) Appl. No.: 15/528,739

(22) PCT Filed: Sep. 1, 2015

(86) PCT No.: PCT/JP2015/074850
§ 371 (c)(1),
(2) Date: May 22, 2017

(87) PCT Pub. No.: WO2016/088417
PCT Pub. Date: Jun. 9, 2016

(65) Prior Publication Data
US 2017/0335090 A1     Nov. 23, 2017

(30) Foreign Application Priority Data

Dec. 2, 2014   (JP) .............................. JP2014-244026

(51) Int. Cl.
| | |
|---|---|
| *C08L 63/00* | (2006.01) |
| *C09J 163/00* | (2006.01) |
| *H01L 23/00* | (2006.01) |
| *H01L 21/56* | (2006.01) |
| *C08K 3/22* | (2006.01) |
| *H01L 23/29* | (2006.01) |
| *H01L 23/31* | (2006.01) |
| *H01L 23/28* | (2006.01) |
| *C08K 9/06* | (2006.01) |
| *C08K 3/36* | (2006.01) |

(52) U.S. Cl.
CPC .................. *C08K 9/06* (2013.01); *C08K 3/22* (2013.01); *C08L 63/00* (2013.01); *H01L 21/563* (2013.01); *H01L 23/295* (2013.01); *H01L 23/3157* (2013.01); *H01L 24/13* (2013.01); *H01L 24/29* (2013.01); *C08K 2003/2227* (2013.01); *C08K 2201/014* (2013.01); *C09J 163/00* (2013.01); *H01L 24/73* (2013.01); *H01L 24/81* (2013.01); *H01L 24/83* (2013.01); *H01L 24/92* (2013.01); *H01L 2224/13147* (2013.01); *H01L 2224/2929* (2013.01); *H01L 2224/29386* (2013.01); *H01L 2224/73204* (2013.01); *H01L 2224/83855* (2013.01); *H01L 2224/92125* (2013.01); *H01L 2924/18161* (2013.01); *H01L 2924/3512* (2013.01)

(58) Field of Classification Search
None
See application file for complete search history.

(56) References Cited

U.S. PATENT DOCUMENTS

| | | | | |
|---|---|---|---|---|
| 6,667,194 B1 * | 12/2003 | Crane | .................. | C07D 303/22 428/620 |
| 2001/0034382 A1 * | 10/2001 | Sumita | ................. | C08G 59/188 523/466 |

FOREIGN PATENT DOCUMENTS

| | | | | |
|---|---|---|---|---|
| JP | 2002226673 | A | * | 8/2002 |
| JP | 2002226673 | A |   | 8/2002 |
| JP | 2005206725 | A | * | 8/2005 |
| JP | 2007-056070 |   |   | 3/2007 |
| JP | 2008088350 | A | * | 4/2008 |
| JP | 2010-103934 |   |   | 5/2010 |
| JP | 2011-089025 | A |   | 5/2011 |
| JP | 2012-149237 | A |   | 8/2012 |
| JP | 2013-018991 | A |   | 1/2013 |

* cited by examiner

*Primary Examiner* — Rachel Kahn
*Assistant Examiner* — Ha S Nguyen
(74) *Attorney, Agent, or Firm* — Muncy, Geissler, Olds and Lowe, P.C.

(57) ABSTRACT

Provided is a liquid sealing material for copper bumps which is inhibited from suffering filler separation during thermal curing and thereby causing bump cracking. Also provided is a resin composition for use as the sealing material. The resin composition according to the present invention comprises (A) a liquid epoxy resin, (B) a hardener, and (C) an alumina filler having a surface treated with the silane coupling agent of the following formula (1).

6 Claims, No Drawings

LIQUID SEALING MATERIAL FOR COPPER BUMP, AND RESIN COMPOSITION FOR USE AS SAME

TECHNICAL FIELD

The present invention relates to a liquid sealing material for copper bumps, and a resin composition used for the liquid sealing material for copper bumps.

BACKGROUND ART

As electronic components get smaller, lighter and more sophisticated, the semiconductor packaging form is changing from wire bonding type to flip-chip type.

A flip-chip semiconductor apparatus has a configuration in which electrode portions on a substrate are connected to a semiconductor device via bump electrodes. The thus configured semiconductor apparatus suffers from the following problem: When heat is applied as in temperature cycling, the bump electrodes are stressed due to a difference in coefficient of thermal expansion between the substrate made of an organic material such as epoxy resin and the semiconductor device, thus causing the bump electrodes to have defects such as cracking. In order to suppress the occurrence of such defects, it is widely performed to seal gaps between the semiconductor device and the substrate with a liquid sealing material called "underfill" to secure them to each other, thereby improving the thermal cycle resistance.

A liquid sealing material for use as an underfill is required to be excellent in injection properties, adhesive properties, curing properties, storage stability and the like, and not to generate voids. In addition, a portion sealed with the liquid sealing material is required to be excellent in moisture resistance, thermal cycle resistance, reflow resistance, cracking resistance, warpage resistance and the like.

To satisfy the foregoing requirements, an epoxy resin-based material is widely used as the liquid sealing material for use as the underfill.

It is known that controlling the difference in coefficient of thermal expansion between a substrate made of an organic material such as epoxy resin and a semiconductor device and reinforcing bump electrodes by adding a filling material (hereinafter referred to as "filler") made of an inorganic substance such as a silica filler to a liquid sealing material are effective to improve the moisture resistance and the thermal cycle resistance, in particular the thermal cycle resistance of a portion sealed with the liquid sealing material (see Patent Literature 1).

In recent years, particularly in the high-density flip-chip mounting, copper pillar-bumps (hereinafter, referred to as "copper bumps") have been used. As compared with conventional solder bumps, the copper bumps are effective in, for example, reducing the bump pitch, reducing the usage of lead so as to decrease the impact on the environment, increasing the thermal conductivity so as to improve the heat dissipation properties, and increasing the electric conductivity so as to decrease the parasitic resistance.

Patent Literature 2 describes in the paragraph [0003] an example of conventional procedure for flip-chip mounting using the copper bumps and the underfill. Patent Literature 2 teaches that when the flip-chip mounting is performed using the copper pillars according to this procedure, the filler contained in the underfill separates from the resin during heat curing so that a filler-free region is formed in the underfill resin, the difference in coefficient of linear expansion between a silicon chip and a substrate cannot be absorbed, and development of cracks in bumps is brought about; this becomes a problem.

CITATION LIST

Patent Literature

Patent Literature 1: JP 2007-56070 A
Patent Literature 2: Re-published PCT International Publication 2010-103934 A

SUMMARY OF INVENTION

Technical Problems

In order to solve the drawbacks of the related art described above, the present invention aims at providing a liquid sealing material for copper bumps that suppresses separation of a filler during heat curing and development of cracks in bumps, and a resin composition used therefor.

Solution to Problems

The inventors of the present invention have made an intensive study as to separation of a filler in a liquid sealing material for copper bumps during heat curing and as a result reached following findings.

With respect to a filler for an underfill in particular, when a silica filler that is widely used as the filler for the underfill is used, separation of the filler during heat curing is likely to occur.

As compared with the silica filler, an alumina filler does not readily separate during heat curing.

Based on the foregoing findings, the inventors of the present invention have the following presumption.

Due to the difference in potential between the copper pillars and solder that are joined to each other, electrophoresis works such that the filler is attracted to the copper pillars during heat curing of the underfill, whereby separation of the filler is brought about.

As described above, in terms of suppressing separation of the filler during heat curing, the alumina filler is preferred to the silica filler. In the meantime, the underfill containing the alumina filler is inferior to the underfill containing the silica filler in the injection properties in injection into gaps between a semiconductor device and a substrate. The reason therefor is that the alumina filler is readily affected by moisture absorption, which causes agglomeration of the alumina filler.

The present invention has been made in view of the foregoing findings and provides a resin composition including (A) a liquid epoxy resin, (B) a curing agent and (C) an alumina filler surface-treated with a silane coupling agent of Formula (1) below.

[Chemical Formula 1]

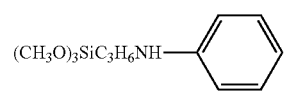

(1)

The resin composition according to the present invention may further include (D) a silane coupling agent.

In the resin composition according to the present invention, the alumina filler (C) surface-treated with the silane coupling agent is preferably contained in an amount of 45 to 77 parts by weight with respect to 100 parts by weight in total of all ingredients of the resin composition.

In addition, the present invention provides a liquid sealing material using the resin composition of the present invention.

In addition, the present invention provides a liquid sealing material for copper bumps using the resin composition of the present invention.

Advantageous Effects of Invention

The resin composition of the present invention used as the liquid sealing material for copper bumps has excellent injection properties in injection into gaps between a semiconductor device and a substrate and achieves suppression of separation of the filler during heat curing and development of cracks in the bumps resulting therefrom.

DESCRIPTION OF EMBODIMENTS

Next, the resin composition of the present invention is described in detail.

The resin composition of the present invention contains ingredients (A) to (C) described below as essential ingredients.

(A) Liquid Epoxy Resin

A liquid epoxy resin as the ingredient (A) is an ingredient constituting a base compound of the resin composition of the present invention.

In the present invention, the liquid epoxy resin refers to an epoxy resin which is liquid at ordinary temperature.

Illustrative examples of the liquid epoxy resin in the present invention include bisphenol A epoxy resins having an average molecular weight of about 400 or less; branched polyfunctional bisphenol A epoxy resins such as p-glycidyloxyphenyldimethyl trisbisphenol A diglycidyl ether; bisphenol F epoxy resins; phenol novolac epoxy resins having an average molecular weight of about 570 or less; alicyclic epoxy resins such as vinyl(3,4-cyclohexene)dioxide, (3,4-epoxycyclohexyl)methyl 3,4-epoxycyclohexylcarboxylate, bis(3,4-epoxy-6-methylcyclohexylmethyl)adipate, and 2-(3,4-epoxycyclohexyl)5,1-spiro(3,4-epoxycyclohexyl)-m-dioxane; biphenyl epoxy resins such as 3,3',5,5'-tetramethyl-4,4'-diglycidyloxybiphenyl; glycidyl ester epoxy resins such as diglycidyl hexahydrophthalate, diglycidyl 3-methylhexahydrophthalate, and diglycidyl hexahydroterephthalate; glycidyl amine epoxy resins such as diglycidylaniline, diglycidyltoluidine, triglycidyl-p-aminophenol, tetraglycidyl-m-xylylenediamine, and tetraglycidyl bis(aminomethyl)cyclohexane; as well as hydantoin epoxy resins such as 1,3-diglycidyl-5-methyl-5-ethylhydantoin; and naphthalene ring-containing epoxy resins. In addition, an epoxy resin having a silicone skeleton such as 1,3-bis(3-glycidoxypropyl)-1,1,3,3-tetramethyldisiloxane can be also used. Moreover, additional examples include diepoxide compounds such as (poly)ethylene glycol diglycidyl ether, (poly)propylene glycol diglycidyl ether, butanediol diglycidyl ether, neopentyl glycol diglycidyl ether and cyclohexane dimethanol diglycidyl ether; and triepoxide compounds such as trimethylolpropane triglycidyl ether and glycerol triglycidyl ether.

Of these, liquid bisphenol epoxy resins, liquid aminophenol epoxy resins, silicone-modified epoxy resins and naphthalene epoxy resins are preferable. Further, liquid bisphenol A epoxy resins, liquid bisphenol F epoxy resins, p-aminophenol liquid epoxy resins, and 1,3-bis(3-glycidoxypropyl)tetramethyldisiloxane are more preferable.

The liquid epoxy resins as the ingredient (A) may be used alone or in combination of two or more thereof.

An epoxy resin which is solid at ordinary temperature can also be used by combination use with a liquid epoxy resin if it exhibits a liquid state in the form of a mixture.

(B) Curing Agent

The curing agent as the ingredient (B) is not particularly limited as long as it is an epoxy resin curing agent. Known curing agents can be used, and any of an amine curing agent, an acid anhydride curing agent and a phenolic curing agent may be used.

Specific examples of amine curing agents include aliphatic polyamines such as triethylenetetramine, tetraethylenepentamine, m-xylenediamine, trimethylhexamethylenediamine, and 2-methylpentamethylenediamine; alicyclic polyamines such as isophorone diamine, 1,3-bisaminomethylcyclohexane, bis(4-aminocyclohexyl)methane, norbornene diamine, and 1,2-diaminocyclohexane; piperazine polyamines such as N-aminoethyl piperazine and 1,4-bis(2-amino-2-methylpropyl)piperazine; and aromatic polyamines such as diethyltoluenediamine, dimethylthiotoluenediamine, 4,4'-diamino-3,3'-diethyldiphenylmethane, bis(methylthio)toluenediamine, diaminodiphenylmethane, m-phenylenediamine, diaminodiphenyl sulfone, diethyltoluenediamine, trimethylene bis(4-aminobenzoate), and polytetramethylene oxide-di-p-aminobenzoate. T-12 (trade name; manufactured by Sanyo Chemical Industries, Ltd.) (amine equivalent: 116) is one of the commercialized products thereof.

Specific examples of acid anhydride curing agents include alkylated tetrahydrophthalic anhydrides such as methyltetrahydrophthalic anhydride, methylhexahydrophthalic anhydride, and methyltetrahydrophthalic anhydride; hexahydrophthalic anhydride; methyl himic anhydride; succinic anhydride substituted with an alkenyl group; methyl nadic anhydride; and glutaric anhydride.

Specific examples of phenolic curing agents include all kinds of phenolic hydroxyl group-containing monomers, oligomers and polymers, such as phenol novolac resins and their alkylated or allylated products, cresol novolac resins, phenol aralkyl (phenylene or biphenylene skeleton-containing) resins, naphthol aralkyl resins, triphenolmethane resins and dicyclopentadiene phenol resins.

Of these, amine curing agents are preferable because of their excellent moisture resistance and thermal cycle resistance. In particular, diethyltoluenediamine, dimethylthiotoluenediamine, and 4,4'-diamino-3,3'-diethyldiphenylmethane are preferable because of their excellent heat resistance, mechanical properties, adhesion, electric properties, and moisture resistance. In addition, since they exhibit a liquid state at ordinary temperature, they are preferable for use as the epoxy resin curing agent in the resin composition of the present invention.

The curing agents as the ingredient (B) may be used alone or in combination of two or more thereof.

In the resin composition according to the present invention, the amount of the curing agent as the ingredient (B) to be incorporated is not particularly limited and is preferably in a range of 0.5 to 1.6 equivalents and more preferably 0.6 to 1.3 equivalents per equivalent of epoxy groups in the liquid epoxy resin as the ingredient (A).

(C) Alumina Filler Surface-Treated with a Silane Coupling Agent of Formula (1) Below

[Chemical Formula 2]

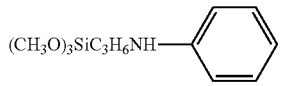 (1)

The alumina filler as the ingredient (C) is added for the purpose of improving moisture resistance and thermal cycle resistance, particularly, thermal cycle resistance of the sealed portion. The thermal cycle resistance is improved by addition of the alumina filler because expansion and contraction of the cured sealing material composition due to thermal cycling can be suppressed as the coefficient of linear expansion deceases.

The alumina filler is used as the ingredient (C) because, as described above, the alumina filler having a higher isopotential point than that of the silica filler maintains a positive potential when used as the liquid sealing material for copper bumps so as not to be affected by electrophoresis during heat curing, whereby separation of the filler is unlikely to occur, and development of cracks in the bumps can be suppressed.

Meanwhile, as described above, the liquid sealing material containing the alumina filler is inferior to the liquid sealing material containing the silica filler in injection properties in injection into gaps between a semiconductor device and a substrate. In the present invention, through the use of the alumina filler surface-treated with a silane coupling agent of Formula (1) above as the ingredient (C), the injection properties in injection into gaps between a semiconductor device and a substrate are improved because the surface treatment with the silane coupling agent of Formula (1) above allows moisture-absorption resistance of the alumina filler to be improved to prevent the alumina filler from agglomerating, whereas surface treatment with another silane coupling agent than the silane coupling agent of Formula (1) above causes agglomeration of the alumina filler due to the silane coupling agent. Accordingly, the surface treatment with the silane coupling agent of Formula (1) above is a way to prevent the alumina filler from agglomerating, which explains why the resin composition using the alumina filler surface-treated with the silane coupling agent of Formula (1) above has the improved injection properties in injection into gaps between a semiconductor device and a substrate.

In the resin composition according to the present invention, the alumina filler surface-treated with the silane coupling agent as the ingredient (C) is preferably contained in an amount of 45 to 77 parts by weight with respect to 100 parts by weight in total of all ingredients of the resin composition.

The resin composition containing the alumina filler as the ingredient (C) in an amount of less than 45 parts by weight has a so high coefficient of linear expansion that, when used for the liquid sealing material for copper bumps, the thermal cycle resistance of a sealed portion would be poor.

On the other hand, the resin composition containing the alumina filler as the ingredient (C) in an amount of more than 77 parts by weight has a so high viscosity that, when used for the liquid sealing material for copper bumps, the injection properties in injection into gaps between a semiconductor device and a substrate would be poor.

The alumina filler as the ingredient (C) is contained in an amount of more preferably 50 to 75 parts by weight, even more preferably, 50 to 70 parts by weight.

In the resin composition according to the present invention, the alumina filler as the ingredient (C) has an average particle size of preferably 0.1 to 10 μm in terms of flowability of the resin composition.

The alumina filler as the ingredient (C) has an average particle size of more preferably 0.5 to 5 μm, even more preferably, 0.7 to 1.7 μm.

The alumina filler as the ingredient (C) is not particularly limited in shape but may be in any of a particle shape, a powder shape and a scale-like shape. When the alumina filler is in another shape than a powder shape, the average particle size of the alumina filler refers to an average maximum particle size thereof.

The resin composition of the present invention may optionally contain ingredients to be mentioned below in addition to the foregoing ingredients (A) to (C).

(D): Silane Coupling Agent

The resin composition of the present invention may contain a silane coupling agent as the ingredient (D) in order to improve the adhesion of the resin composition used as the liquid sealing material for copper bumps.

The silane coupling agent as the ingredient (D) is not particularly limited to the silane coupling agent of the above Formula (1) with which the alumina filler as the ingredient (C) is surface-treated and a variety of silane coupling agents including epoxy-based, amino-based, vinyl-based, methacrylic, acrylic and mercapto-based silane coupling agents may be used. Of these, the epoxy-based silane coupling agent is preferable since the epoxy-based silane coupling agent exhibits an excellent effect in improving the adhesion and the mechanical strength when used as the liquid sealing material for copper bumps.

Specific examples of the epoxy-based silane coupling agent include 3-glycidoxypropyltrimethoxysilane, 2-(3,4-epoxycyclohexyl)ethyltrimethoxysilane (trade name: KBM-303 manufactured by Shin-Etsu Chemical Co., Ltd.), 3-glycidoxypropylmethyldimethoxysilane (trade name: KBM-402 manufactured by Shin-Etsu Chemical Co., Ltd.), 3-glycidoxypropyltrimethoxysilane (trade name: KBM-403 manufactured by Shin-Etsu Chemical Co., Ltd.), 3-glycidoxypropylmethyldiethoxysilane (trade name: KBE-402 manufactured by Shin-Etsu Chemical Co., Ltd.), and 3-glycidoxypropyltriethoxysilane (trade name: KBE-403 manufactured by Shin-Etsu Chemical Co., Ltd.).

When a silane coupling agent as the ingredient (D) is contained, the silane coupling agent is contained in an amount of preferably 0.01 to 5 parts by weight, more preferably, 0.05 to 3 parts by weight, and even more preferably, 0.1 to 1 parts by weight with respect to 100 parts bay weight in total of all ingredients of the resin composition.

(Other Compounding Agents)

The resin composition of the present invention may further optionally contain ingredients in addition to the foregoing ingredients (A) to (D). Specific examples of such ingredients that may be incorporated include an elastomer, a curing accelerator, a metal complex, a leveling agent, a colorant, an ion trapping agent, an antifoaming agent, and a flame retardant. Types and amounts of the compounding agents are defined in the usual manner.

(Preparation of Resin Composition)

The resin composition of the present invention is prepared by mixing with stirring the above-described ingredients (A)

to (C), and the ingredient (D) if it is to be incorporated, and further optionally other compounding agents to be incorporated.

Mixing with stirring can be performed using a roll mill but is of course not limited to this. In the case where the epoxy resin as the ingredient (A) is solid, it is preferably liquefied or fluidized by heating or other process and mixed.

All ingredients may be mixed together at once, or part of the ingredients may be mixed first, and the remaining ingredients may be mixed later: the procedure therefore may be appropriately altered. When it is difficult for the alumina filler as the ingredient (C) to be evenly dispersed in the liquid epoxy resin as the ingredient (A), the liquid epoxy resin as the ingredient (A) and the alumina filler as the ingredient (C) may be mixed first, and the remaining ingredients may be mixed later.

Next, the characteristics of the resin composition of the present invention are described.

The resin composition of the present invention has a viscosity of preferably up to 200 Pa·s at a temperature of 25° C. and 50 rpm, which viscosity is measured using a rotational viscometer. With a viscosity within the foregoing range, the resin composition used as the liquid sealing material for copper bumps has excellent flowability.

The resin composition of the invention has a viscosity of more preferably up to 100 Pa·s at a temperature of 25° C. and 50 rpm.

In addition, the resin composition of the present invention used as the liquid sealing material for copper bumps has excellent injection properties in injection into gaps between a semiconductor device and a substrate. Specifically, when injection into gaps is evaluated by a procedure described below in Examples, injecting time is preferably 1200 seconds or shorter.

When the resin composition of the present invention is used as the liquid sealing material for copper bumps, separation of the alumina filler during heat curing is suppressed. Specifically, a filler separation index evaluated by a procedure described below in Examples is preferably at least 50 and more preferably at least 55.

Next, a method of using the resin composition according to the present invention is described in connection with its use as the liquid sealing material for copper bumps.

When the resin composition of the present invention is used as the liquid sealing material for copper bumps, the resin composition of the present invention is filled into gaps between a substrate and a semiconductor device according to the following procedure.

When the resin composition of the present invention is applied to one end of the semiconductor device while heating the substrate to 70 to 130° C., for example, the resin composition of the present invention is filled into the gaps between the substrate and the semiconductor device by capillary action. At this time, in order to reduce the time required to fill the resin composition of the present invention, the substrate may be inclined, or a difference in pressure between inside and outside the gaps may be imparted.

After the gaps are filled with the resin composition of the present invention, the substrate is heated at a predetermined temperature for a predetermined period of time, to be more specific, at 80 to 200° C. for 0.2 to 6 hours to cure the resin composition under heating, thereby sealing the gaps.

EXAMPLES

The present invention is described below in further detail by way of examples. However, the present invention should not be construed as being limited thereto.

Examples 1 to 16 and Comparative Examples 1 to 5

A roll mill was used to knead ingredients at compounding ratios shown in Tables below to prepare liquid sealing materials in Examples 1 to 16 and Comparative Examples 1 to 5. It should be noted that the liquid epoxy resin as the ingredient (A) and the alumina filler as the ingredient (C) were mixed first, and the remaining ingredients were mixed later. Numerical values as to the respective ingredients in Tables are each shown as a part by weight.

(A) Epoxy Resin

Epoxy resin A1: Bisphenol F epoxy resin; product name: YDF8170; New Nippon Steel Chemical Co., Ltd.; epoxy equivalent: 158 g/eq Epoxy resin A2: Bisphenol A epoxy resin; product name: 850CRP; DIC Corporation; epoxy equivalent: 170 to 175 g/eq Epoxy resin A3: Naphthalene epoxy resin; product name: 4032D; DIC Corporation; epoxy equivalent: 136 to 148 g/eq Epoxy resin A4: Multifunctional epoxy resin; product name: 630; Mitsubishi Chemical Corporation; epoxy equivalent: 90 to 105 g/eq (B) Curing Agent Curing agent B1: Amine curing agent; 4,4'-diamino-3,3'-diethyldiphenylmethane; product name: KAYAHARD A-A; Nippon Kayaku Co., Ltd.

Curing agent B2: Amine curing agent; dimethylthiotoluenediamine (including modified aromatic amines); product name: EH105L; ADEKA Corporation Curing agent B3: Amine curing agent; diethyltrienediamine; product name: ETHACURE 100; Albemarle Japan Corporation Curing agent B4: Acid anhydride curing agent; product name: YH307; Mitsubishi Chemical Corporation Curing agent B5: Phenolic curing agent; product name: MEH-8005; Meiwa Plastic Industries, Ltd.

(C) Filler

Filler C1: Alumina filler (average particle size: 0.7 μm) surface-treated with a silane coupling agent of Formula (1) below (product name: KBM573 (Shin-Etsu Chemical Co., Ltd.))

[Chemical Formula 3]

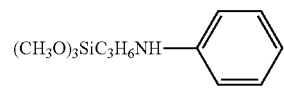

(1)

Filler C2: Alumina filler (average particle size: 1.7 μm) surface-treated with a silane coupling agent of Formula (1) (product name: KBM573 (Shin-Etsu Chemical Co., Ltd.))

Filler C3: Surface-untreated silica filler (average particle size: 0.7 μm)

Filler C4: Surface-untreated alumina filler (average particle size: 0.7 μm)
Filler C5: Alumina filler (average particle size: 0.7 μm) surface-treated with an epoxy-based silane coupling agent (3-glycidoxypropyltrimethoxysilane); product name: KBM403 (Shin-Etsu Chemical Co., Ltd.)
Filler C6: Alumina filler (average particle size: 0.7 μm) surface-treated with a methacrylic silane coupling agent (3-methacryloxypropyltriethoxysilane); product name: KBM503 (Shin-Etsu Chemical Co., Ltd.)
Filler C7: Alumina filler (average particle size: 0.7 μm) surface-treated with an amino-based silane coupling agent (3-aminopropyltrimethoxysilane); product name: KBM903 (Shin-Etsu Chemical Co., Ltd.)
(D) Silane Coupling Agent
Silane coupling agent D1: Epoxy-based silane coupling agent (3-glycidoxypropyltrimethoxysilane); product name: KBM403 (Shin-Etsu Chemical Co., Ltd.)
Silane coupling agent D2: Silane coupling agent of Formula (1); product name: KBM573 (Shin-Etsu Chemical Co., Ltd.)
(E) Curing Accelerator
Curing accelerator E1: 2-Ethyl-4-methylimidazole; product name: 2P4MZ; Shikoku Chemicals Corporation The prepared resin compositions were used as evaluation samples to perform the following evaluations.

(Filler Separation Index)

The resin compositions prepared according to the foregoing procedure were each injected into gaps (50 μm) between a wiring substrate having copper bumps and a semiconductor device and thereafter heated at 150° C. for two hours to be cured. Cross-sectional images of the cured resins were taken using a scanning electron microscope (SEM), and the taken images were analyzed by image processing software on a computer as described below. That is, a region corresponding to the resin composition was specified in each of the images, and binarization processing was performed using the median value of a luminance distribution of the specified region as a reference. In the binarized image, a white portion shows the filler, while a black portion shows a resin ingredient other than the filler. Then, the specified region was separated along a boundary L between the copper pillars and the solder into two regions: a region Ra on the copper pillar side and a region Rb on the solder side. Based on each of the image of the region Ra on the copper pillar side and the image of the region Rb on the solder side, an occupancy of the filler in each of the regions was calculated to obtain a separation index according to the formula below.

Separation index=100×(Occupancy in Region $Ra$)/(Occupancy in Region $Rb$)

(Viscosity)

A Brookfield viscometer was used to measure the viscosity of the evaluation samples just after being prepared at a liquid temperature of 25° C. and 50 rpm.

(Thixotropic Index (T.I.))

A rotational viscometer HBDV-1 (with a spindle SC4-14) available from Brookfield was used to measure the viscosity (Pa·s) at 5 rpm and 25° C. and the viscosity (Pa·s) at 50 rpm and 25° C. Each value obtained by dividing a viscosity measurement at 5 rpm by a viscosity measurement at 50 rpm (the ratio of the viscosity at 5 rpm to the viscosity at 50 rpm) is shown as a thixotropic index.

(Injection Properties)

Specimens in each of which a glass plate was fixed in place of a semiconductor device on an organic substrate (FR-4 substrate) with a gap of 50 μm therebetween were prepared. Each of the specimens was placed on a hot plate set at a temperature of 110° C., the resin composition was applied to one end of the glass plate, and a time required until an injection distance reaches 20 mm was measured. This procedure was repeated twice, and the average value of the obtained measurement values was construed as a measurement value of the injection time.

TABLE 1

|  | Example 1 | Example 2 | Example 3 | Example 4 | Example 5 | Example 6 | Example 7 | Example 8 |
|---|---|---|---|---|---|---|---|---|
| Epoxy resin A1 | 25.7 | 25.7 | 39.2 | 21.4 |  | 25.5 | 25.5 | 30.0 |
| Epoxy resin A2 |  |  |  |  |  |  |  |  |
| Epoxy resin A3 |  |  |  |  |  |  |  |  |
| Epoxy resin A4 |  |  |  |  | 15.15 |  |  |  |
| Curing agent B1 | 10.3 | 10.3 | 15.8 | 8.6 |  | 10.2 | 10.2 | 6.0 |
| Curing agent B2 |  |  |  |  | 9.85 |  |  |  |
| Curing agent B3 |  |  |  |  |  |  |  |  |
| Curing agent B4 |  |  |  |  |  |  |  |  |
| Curing agent B5 |  |  |  |  |  |  |  |  |
| Filler C1 | 64 |  | 45 | 70 | 75 | 64 | 64 | 64 |
| Filler C2 |  | 64 |  |  |  |  |  |  |
| Filler C3 |  |  |  |  |  |  |  |  |
| Filler C4 |  |  |  |  |  |  |  |  |
| Filler C5 |  |  |  |  |  |  |  |  |
| Filer C6 |  |  |  |  |  |  |  |  |
| Filler C7 |  |  |  |  |  |  |  |  |
| Silane coupling agent D1 |  |  |  |  |  | 0.3 |  |  |
| Silane coupling agent D2 |  |  |  |  |  |  | 0.3 |  |
| Curing accelerator E1 |  |  |  |  |  |  |  |  |
| TOTAL | 100 | 100 | 100 | 100 | 100 | 100 | 100 | 100 |
| Curing agent equivalent/Epoxy equivalent | 1.0 | 1.0 | 1.0 | 1.0 | 1.0 | 1.0 | 1.0 | 0.5 |
| Filler separation index | 82 | 70 | 78 | 97 | 88 | 83 | 55 | 80 |
| Viscosity (50 rpm)[Pa · s] | 19 | 14 | 10 | 41 | 153 | 18 | 13 | 17 |
| T.I. | 0.9 | 0.9 | 0.9 | 0.49 | 0.19 | 0.8 | 0.8 | 0.8 |
| Injection properties (110° C, sec) | 112 | 600 | 94 | 912 | 1035 | 120 | 119 | 98 |

TABLE 2

|  | Example 9 | Example 10 | Example 11 | Example 12 | Example 13 | Example 14 | Example 15 | Example 16 |
|---|---|---|---|---|---|---|---|---|
| Epoxy resin A1 | 20.9 |  |  |  | 26 | 28.1 | 14.25 | 19.05 |
| Epoxy resin A2 |  | 26.3 |  |  |  |  |  |  |
| Epoxy resin A3 |  |  | 25 |  |  |  |  |  |
| Epoxy resin A4 |  |  |  | 21.5 |  |  |  |  |
| Curing agent B1 | 15.1 | 9.7 | 11 | 14.5 |  |  |  |  |
| Curing agent B2 |  |  |  |  | 10 |  |  |  |
| Curing agent B3 |  |  |  |  |  | 7.9 |  |  |
| Curing agent B4 |  |  |  |  |  |  | 21 |  |
| Curing agent B5 |  |  |  |  |  |  |  | 16.2 |
| Filler C1 | 64 | 64 | 64 | 64 | 64 | 64 | 64 | 64 |
| Filler C2 |  |  |  |  |  |  |  |  |
| Filler C3 |  |  |  |  |  |  |  |  |
| Filler C4 |  |  |  |  |  |  |  |  |
| Filler C5 |  |  |  |  |  |  |  |  |
| Filer C6 |  |  |  |  |  |  |  |  |
| Filler C7 |  |  |  |  |  |  |  |  |
| Silane coupling agent D1 |  |  |  |  |  |  |  |  |
| Silane coupling agent D2 |  |  |  |  |  |  |  |  |
| Curing accelerator E1 |  |  |  |  |  |  | 0.75 | 0.75 |
| TOTAL | 100 | 100 | 100 | 100 | 100 | 100 | 100 | 100 |
| Curing agent equivalent/ Epoxy equivalent | 1.8 | 1.0 | 1.0 | 1.0 | 1.0 | 1.0 | 1.0 | 1.0 |
| Filler separation index | 84 | 80 | 86 | 84 | 78 | 60 | 66 | 75 |
| Viscosity (50 rpm)[Pa·s] | 20 | 34 | 82 | 18 | 17 | 15 | 21 | 58 |
| T.I. | 1 | 1 | 1 | 0.9 | 0.9 | 1 | 1.3 | 0.7 |
| Injection properties (110° C, sec) | 99 | 101 | 121 | 912 | 98 | 95 | 810 | 180 |

TABLE 3

|  | Comparative Example 1 | Comparative Example 2 | Comparative Example 3 | Comparative Example 4 | Comparative Example 5 |
|---|---|---|---|---|---|
| Epoxy resin A1 | 25.7 | 25.7 | 25.7 | 25.7 | 25.7 |
| Epoxy resin A2 |  |  |  |  |  |
| Epoxy resin A3 |  |  |  |  |  |
| Epoxy resin A4 |  |  |  |  |  |
| Curing agent B1 | 10.3 | 10.3 | 10.3 | 10.3 | 10.3 |
| Curing agent B2 |  |  |  |  |  |
| Curing agent B3 |  |  |  |  |  |
| Curing agent B4 |  |  |  |  |  |
| Curing agent B5 |  |  |  |  |  |
| Filler C1 |  |  |  |  |  |
| Filler C2 |  |  |  |  |  |
| Filler C3 | 64 |  |  |  |  |
| Filler C4 |  | 64 |  |  |  |
| Filler C5 |  |  | 64 |  |  |
| Filler C6 |  |  |  | 64 |  |
| Filler C7 |  |  |  |  | 64 |
| Silane coupling agent D1 |  |  |  |  |  |
| Silane coupling agent D2 |  |  |  |  |  |
| Curing accelerator E1 |  |  |  |  |  |
| TOTAL | 100 | 100 | 100 | 100 | 100 |
| Curing agent equivalent/ Epoxy equivalent | 1.0 | 1.0 | 1.0 | 1.0 | 1.0 |
| Filler separation index | 48 | 70 | 60 | 76 | 50 |
| Viscosity (50 rpm)[Pa·s] | 61 | 22 | 13 | 17 | 22 |
| T.I. | 0.48 | 0.9 | 0.9 | 1.4 | 0.7 |
| Injection properties (110° C., sec) | 682 | NA | NA | NA | NA |

Evaluation results of the filler separation index, the viscosity measured at a liquid temperature of 25° C. and at 50 rpm, the thixotropic index (T.I.) and the 20 mm injection properties in Examples 1 to 16 were all excellent. Examples 2 to 16 were different from Example 1 as described below.

Example 2: An alumina filler having a different average particle size (average particle size: 1.7 μm) was used.

Examples 3 to 5: The alumina filler content was different from that in Example 1 (45 parts by weight (Example 3); 70 parts by weight (Example 4); and 75 parts by weight (Example 5) with respect to 100 parts by weight in total of all ingredients).

Examples 6 and 7: Ingredient (D) (silane coupling agent) was contained: an epoxy-based silane coupling agent (3-glycidoxypropyltrimethoxysilane) was used (Example 6); and a silane coupling agent of the same type as the one used for surface-treatment of the alumina filler was used (Example 7).

Examples 8 and 9: The equivalent ratio of a curing agent was different from that in Example 1 (equivalent ratio of the curing agent: 0.5 (Example 8); and 1.8 (Example 9)).

Examples 10 to 12: The type of the epoxy resin as the ingredient (A) was different from that in Example 1 (bisphenol F epoxy resin (epoxy equivalent: 170 to 175 g/eq) (Example 10); naphthalene epoxy resin (epoxy equivalent: 136 to 148 g/eq) (Example 11); and multifunctional epoxy resin (epoxy equivalent: 90 to 105 g/eq) (Example 12)).

Examples 13 and 14: The type of the amine curing agent as the ingredient (B) was different from that in Example 1 (dimethylthiotoluenediamine (including modified aromatic amines) (Example 13); diethyltrienediamine (Example 14)).

Example 15: An acid anhydride curing agent was used as the ingredient (B).

Example 16: A phenolic curing agent was used as the ingredient (B).

Meanwhile, in Comparative Example 1 where a silica filler was used as the ingredient (C), the filler separation index was low, and separation of the filler during heat curing was observed.

In addition, in Comparative Examples 2, 3, 4 and 5 where a surface-untreated alumina filler, an alumina filler surface-treated with an epoxy-based silane coupling agent (3-glycidoxypropyltrimethoxysilane), an alumina filler surface-treated with a methacrylic silane coupling agent (3-methacryloxypropyltriethoxysilane) and an alumina filler surface-treated with an amino-based silane coupling agent (3-aminopropyltrimethoxysilane) were used, respectively, as the ingredient (C), the injection properties were evaluated but injection was impossible.

The invention claimed is:

1. A resin composition comprising: (A) a liquid epoxy resin; (B) a curing agent; and (C) an alumina filler surface-treated with a silane coupling agent of Formula (1) below

[Chemical Formula 1]

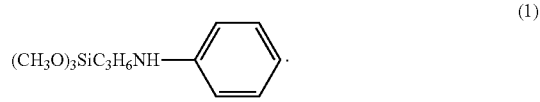

(1)

wherein the alumina filler has an average particle size of 0.7 μm,
the alumina filler is surface-treated in advance with the silane coupling agent of Formula (1) prior to mixing with the liquid epoxy resin and the curing agent,
the liquid epoxy resin is a bisphenol F epoxy resin, the curing agent is an amine curing agent, the ratio of the curing agent equivalent to epoxy group equivalent is 0.6-1.3, the alumina filler (C) surface-treated with the silane coupling agent is contained in an amount of 64 parts by weight with respect to 100 parts by weight in total of all ingredients of the resin composition,
wherein the curing agent is 4,4'-diamino-3,3'-diethyldiphenylmethane.

2. The resin composition according to claim 1, further comprising (D) a silane coupling agent.

3. A liquid sealing material comprising the resin composition according to claim 1.

4. A liquid sealing material comprising the resin composition according to claim 2.

5. A liquid sealing material for copper bumps comprising the resin composition according to claim 1.

6. A liquid sealing material for copper bumps comprising the resin composition according to claim 2.

* * * * *